United States Patent [19]
Paros

[11] 4,406,966
[45] Sep. 27, 1983

[54] ISOLATING AND TEMPERATURE COMPENSATING SYSTEM FOR RESONATORS

[75] Inventor: Jerome M. Paros, Redmond, Wash.
[73] Assignee: Paroscientific, Inc., Redmond, Wash.
[21] Appl. No.: 115,731
[22] Filed: Jan. 28, 1980
[51] Int. Cl.³ .......................................... H01L 41/08
[52] U.S. Cl. .................................. 310/321; 310/338; 310/346; 310/367; 310/329; 73/702; 73/729
[58] Field of Search ............ 310/321, 346, 367, 368, 310/329, 366, 338; 73/700, 702–704, 708, 711, 726, 727, 729, 754, 732, DIG. 4, 766, 778, 717

[56] References Cited
U.S. PATENT DOCUMENTS

| | | | |
|---|---|---|---|
| 3,045,491 | 7/1962 | Hart | 310/338 X |
| 3,247,711 | 4/1966 | Howatt | 310/338 |
| 3,437,849 | 4/1969 | Treatch | 310/346 X |
| 3,470,400 | 9/1969 | Weisbord | 310/321 X |
| 3,505,880 | 4/1970 | Riordan | 73/702 X |
| 3,894,435 | 7/1975 | Shimada et al. | 73/729 |
| 4,020,448 | 4/1977 | Corbett | 310/338 X |
| 4,067,241 | 1/1978 | Corbett | 310/338 X |
| 4,190,782 | 2/1980 | Guess | 310/346 X |
| 4,215,570 | 8/1980 | Nisse | 310/338 |

*Primary Examiner*—Mark O. Budd
*Attorney, Agent, or Firm*—Seed, Berry, Vernon & Baynham

[57] ABSTRACT

A mounting structure for crystal resonators used as frequency standards and transducers which maximizes performance and reduces the sensitivity to environmental errors. In one embodiment, force sensitive crystal resonators having inherent unmounted temperature sensitivities are used in conjunction with reactive spring-like mounting arrangements having predetermined temperature stress characteristics such that the thermally induced mechanical stress of the mounting arrangements changes, compensates, and optimizes the overall combined temperature characteristics. In another embodiment crystal resonators are isolated from the external environment so that they are capable of sensing forces while operating in a vacuum or inert atmosphere. Environmental isolation is provided by bellows and/or diaphragm arrangements used alone or in conjunction with air-tight enclosures which enable forces to be applied to stress-sensitive crystals while isolating the crystals from the external force producing environment.

24 Claims, 7 Drawing Figures

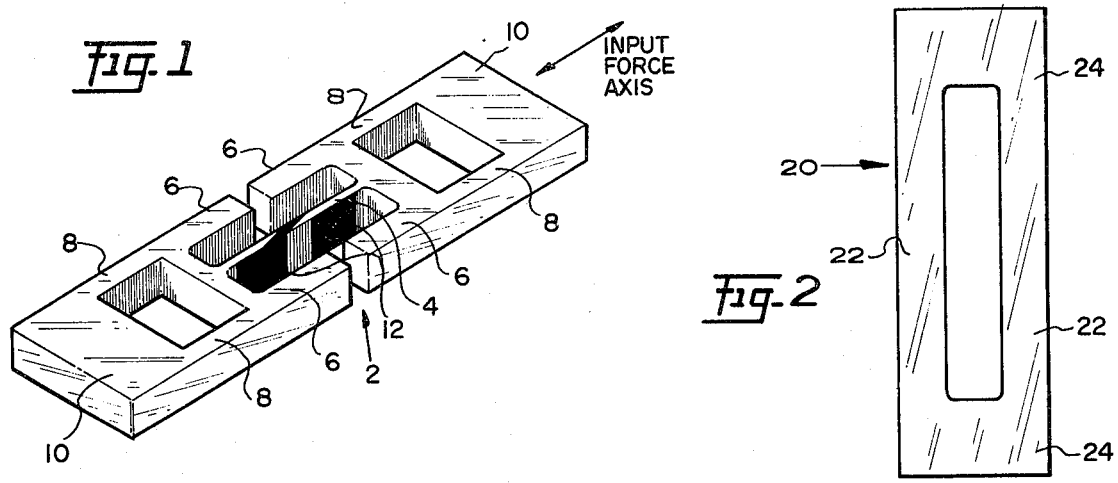
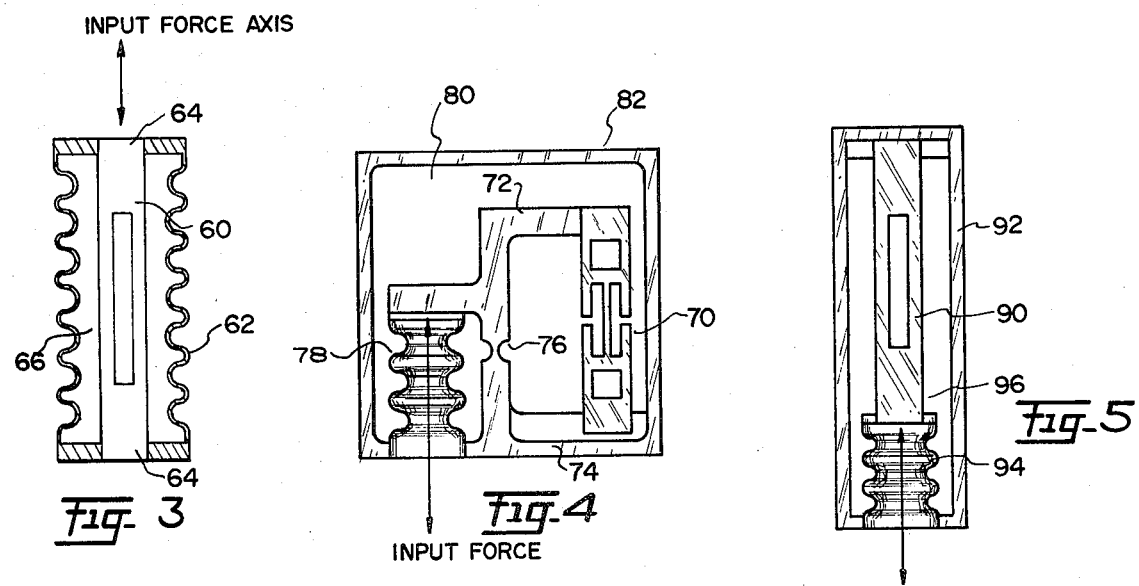
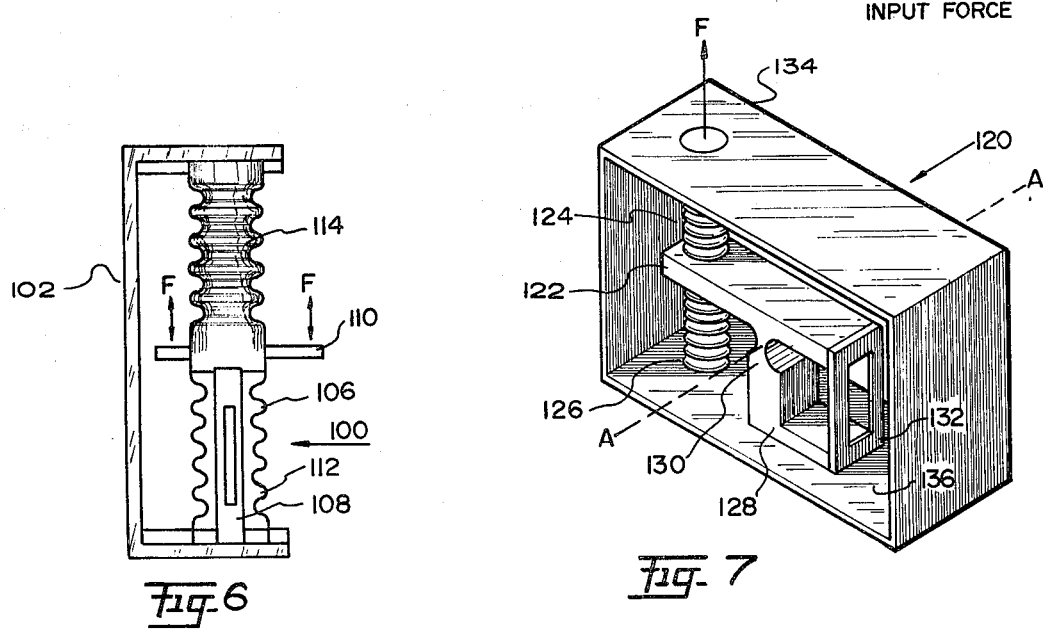

ISOLATING AND TEMPERATURE COMPENSATING SYSTEM FOR RESONATORS

BACKGROUND OF THE INVENTION

1. Field of the Invention

This invention relates to crystal resonators for oscillators and stress sensitive transducers, and more particularly, to improved resonator mounting structures having low sensitivities to environmental effects.

2. Description of the Prior Art

Crystal oscillators with low sensitivity to temperature variations have been widely used as frequency standards. These oscillators, usually fabricated from quartz, may achieve their temperature insensitivity by careful selection of crystallographic axes, compensation through electronic oscillator components, compensation through additional resonators and utilization of combinations of vibrational modes, such as flexural and torsional modes, to achieve specific temperature related performance. Tradeoffs exist in temperature effects versus crystal impedance and other performance aspects as well as manufacturability and cost considerations. It is desirable to have an additional temperature related degree of freedom affecting crystal frequency. This additional flexibility in design is derived from the concept of thermally induced mechanical stress applied to a load sensitive crystal.

In contrast to crystal resonators used as transducers, crystal resonators used as frequency standards should be isolated from and unaffected by external forces. In general, crystal frequency standards have been designed with thin wire mountings attached to nodal points of vibration such that stress cannot be applied to the crystals.

A number of load sensitive crystals and transducers are known. In an unstressed condition, under constant environmental conditions, a crystal has a unique resonant frequency determined by its dimensions and material composition. The resonant frequency increases under tensile loading and decreases under compressive loading. The resonant frequency should thus be a true and accurate measure of the applied load.

Force sensitive crystals are described in U.S. Pat. No. 2,984,111 issued to Kritz and U.S. Pat. No. 3,093,760 issued to Tarasevich in which loads are applied to the crystals near the nodal points. Imprecise location of these nodal points results in energy transmission through the mounts, degrading the "Q", or quality factor, of the resonator with a consequential loss of accuracy. Also, forces and moments produced by the mounting structure can be transmitted to the resonator due to the imprecise nodal point location.

U.S. Pat. No. 3,470,400 issued to Weisbord describes a single beam force transducer with an integral mounting system which effectively decouples the beam vibrations from the mounting point through a spring and mass arrangement. This resonator is complex, relatively large, and difficult to manufacture.

A potentially small, simple and easy to manufacture device using photolithography is the closed end tuning fork described in U.S. Pat. No. 3,238,789 issued to Erdley. The Erdley device consists of two tines or bars vibrating 180 degrees out of phase such that the reactive forces and moments cancel.

Techniques for developing resonators with a low temperature coefficient using combinations of flexural and torsional modes of vibration were described by Momosaki et al in a paper presented in 1979 at the 33rd Annual Symposium on Frequency Control. This approach is both complex and restrictive. A new variable relating frequency to temperature can offer flexibility in design as well as improved performance.

One technique for temperature compensating crystal resonators is described in a paper presented in 1961 by Gerber et al at the Fifteenth Annual Symposium on Frequency Control. Gerber et al disclose mounting a relatively high frequency, shear mode crystal resonator on a base, and biasing the resonator against the base by a pair of temperature sensitive bimetalic bars. One of the bars is used for relatively low temperatures while the other bar is used for higher temperatures. While the Gerber et al approach may be satisfactory for temperature compensating shear mode crystals which are highly insensitive to external forces, it is not applicable to flexurally vibrating crystal resonators which are orders of magnitude more sensitive to external forces. In fact, if the teachings of Gerber et al were applied to flexurally vibrating resonators excessive forces would certainly be imposed on the resonators by the bi-metallic bars.

SUMMARY OF THE INVENTION

It is an object of this invention to provide relatively low frequency, flexurally vibrating resonators with low sensitivty to temperature variations.

It is still another object of this invention to maximize performance by isolating load sensitive from the external environment.

The sensitivity of resonators to temperature variations is minimized by connecting one end of the resonator to a flexible bellows or spring having a coefficient of thermal expansion different from that of the resonator. The coefficient of thermal expansion of the bellows or spring is selected so that the thermally induced stress applied to the resonator combines with the inherent unmounted temperature sensitivity of the resonator, such that the overall temperature sensitivity is relatively low at the operating temperature of the resonator. When the resonator is to be thermally compensated, it is positioned within an elongated resilient spring or bellows having its ends closed by respective covers to which the mounting pads are secured. Alternatively, the resonator may be positioned within an air tight enclosure to which one of the mounting pads is secured. An opening in the enclosure is covered by one end of a thermally compensating flexible bellows with the other end of the bellows being closed by an end cap to which the other mounting pad is secured to allow forces to be applied to the resonator through the bellows. An alternative mounting structure for resonators may also be employed as part of the temperature compensating system. This alternative mounting system includes a rigid force transmitting member adapted to receive a force adjacent one end with one mount of the resonator secured to the force transmitting member adjacent the opposite end. The force transmitting member is mounted on a rigid base by a flexure hinge pivot. The flexure hinge is relatively compliant about a pivot axis perpendicular to the force to allow the force transmitting member to pivot about the axis as a force is applied to the force transmitting member in order to uniformly couple the force to the resonator. The force transmitting member, base and flexure hinge may be positioned within an air-tight enclosure. An opening in the enclosure is covered by one end of a flexible bellows with the other end of the bellows being closed by an end cap to which the force receiving end of the force transmitting member is secured. The coefficient of thermal expansion of the bellows and suspension system may be selected to minimize the overall thermal sensitivity of the resonator at its operating temperature. Pressure compensation may be achieved by placing a second bellows between a surface of the force transmitting member opposite the first bellows with the bellows extending to a second opening in the enclosure. The cross-sectional areas and positions of the two bellows are selected to cause the moment imparted to the force transmitting member by the pressure in the first bellows to counteract the moment imparted to the force transmitting member by the pressure in the second bellows.

BRIEF DESCRIPTION OF THE DRAWINGS

FIG. 1 is an isometric view illustrating a conventional single beam force transducer with integral mounting isolation.

FIG. 2 is a plan view illustrating a conventional closed end tuning fork force sensor.

FIG. 3 is a cross-sectional view of a load sensitive crystal encapsulated by a bellows or spring assembly for temperature compensating and environmentally isolating the crystal.

FIG. 4 is a plan view of an inventive suspension system, bellows or spring, and crystal arrangement offering improved temperature performance and environmental isolation.

FIG. 5 is a plan view illustrating one embodiment of the inventive bellows and crystal arrangement isolating the environment of the device from the force producing structure.

FIG. 6 is a plan view illustrating an inventive embodiment of a force sensitive crystal which is isolated from the environment through a double bellows arrangement which is insensitive to pressure variations.

FIG. 7 is an isometric view of one embodiment of a mounting system which isolates the crystal from external pressure variations through a bellows and suspension system arrangement.

DETAILED DESCRIPTION OF THE INVENTION

The present invention is equally applicable to load sensitive crystal resonators of various shapes and configurations; however, for simplicity and clarity, only the application to flexurally vibrating force sensitive beam and closed end tuning fork devices will be described in detail, it being understood that the same or similar principles apply in the general case.

FIG. 1 illustrates a conventional single beam force transducer 2 with integral mounting isolation as disclosed in the aforementioned patent to Weisbord. The transducer 2 consists of a flexurally vibrating center beam 4, two sets of isolator masses 6, and isolator springs 8 extending from each end of the beam 4 to mounting surfaces 10. Axial forces, applied along the longitudinal axis of the transducer 2 stress the vibrating beam 4, thereby changing its resonant frequency in accordance with the magnitude of the applied loads. The isolator masses 6 and isolator springs 8 are designed to decouple the reactive forces and moments generated by the beam 4 from the mounts 10, thus reducing the energy losses. As a result, the transducer 2 has a high "Q" so that its resonant frequency is an accurate representation of the applied forces. The beam 4 may be driven at its resonant frequency using electrodes 12 and oscillator circuitry in any conventional manner such as is described in U.S. Pat. No. 3,479,536 issued to Norris. Although effective in many ways as a force sensitive crystal, the transducer 2 is complex, relatively large and difficult to manufacture. It also suffers from a relatively high sensitivity to temperature and is not environmentally decoupled from the force producing structure.

FIG. 2 is a plan view of a conventional closed end tuning fork 20 as described in the aforementiond patent to Erdley. This device 20 achieves low energy loss, high "Q" operation by driving a pair of closely matched tines 22, 180 degrees out of phase, thus cancelling the reactive moments and forces which might be transmitted to a mount 24 from which the tines 22 project.

Under constant environmental conditions, the resonant frequency in Hertz, $f_o$, of an unstressed fixed-ended flexurally vibrating beam of length L, thickness t, width b, modulus of elasticity E and density d is given by the formula:

$$f_o = \text{(Constant)} \frac{t}{L^2} \sqrt{\frac{E}{d}} \qquad \text{(Equation 1)}$$

Although the resonant frequency is generally a non-linear function of the applied load, the first order load sensitivity, $S_F$, may be calculated as:

$$S_F = \text{(Constant)} \frac{L^2}{Ebt^3} \text{ (applied load)} \qquad \text{(Equation 2)}$$

The quantitative relationships between resonant frequency, applied load, and resonator dimensions and composition can be determined from the above formulae. In particular, thermally induced mechanical stress may be applied to load sensitive crystals to optimize the overall temperature performance as described hereinafter.

Although a number of load sensitive crystals may be mechanically stressed through thermal means to optimize overall temperature performance, the following discussions will illustrate the inventive thermal compensation using flexing bar crystals such as the single beam force transducer with integral mounting isolation and the closed end tuning fork force sensor.

The resonant frequency in Hz, f, of an oscillating crystal can be expressed as a power series expansion function of the temperature, T, taken about the reference temperature, To, as follows:

$$f = f_o[1 + A(T-T_o) + B(T-T_o)^2 + C(T-T_o)^3 +] \qquad (3)$$

The coefficients A, B, C are the first, second and third order temperature coefficients, respectively. In substances such as quartz, these coefficients are strongly related to the orientation of the crystallographic axes.

Interrelationships also exit between the coefficients and the temperature turnover point, $T_p$, which is the temperature at which the frequency function given by Equation 3 peaks and the slope of the frequency-temperature curve equals zero. The frequency sensitivity to temperature, $S_T$, may be obtained by differentiating Equation 3 with respect to temperature as follows:

$$S_T = \frac{1}{f_0}\left(\frac{\partial f}{\partial T}\right) = A + 2B(T - T_0) + 3C(T - T_0)^2 \quad \text{(Equation 4)}$$

Equation 4 indicates that the temperature sensitivity can be minimized through the use of compensating first, second and third order terms and by operating at temperatures other than the reference temperature $T_0$. In general, however, the coefficients A, B, C and the temperature turnover point are functions of the crystallographic orientation. Also, each successive order of temperature coefficient decreases by several orders of magnitude. This means that coefficients B and C are so small that they can only be used to compensate for the effects of A at temperatures far from the reference temperature. Thus, to minimize the temperature sensitivity at reasonable turnover temperatures, an additional thermal degree of freedom can be employed which affects crystal frequency. It has been shown by Equation 2 that crystals change frequency due to applied loads. As will be shown, frequency changes due to thermally induced mechanical stress, $S_F$, can combine with the unmounted temperature sensitivity, $S_T$, to provide optimized total temperature performance.

As illustrated in FIG. 3, a load sensitive crystal tuning fork 60 is encapsulated by a bellows 62 which is attached to tuning fork mounts 64. The bellows 62 has a coefficient of thermal expansion, $\alpha_B$, which is different from that of the crystal, $\alpha_C$. If the temperature is changed, the thermal mismatch causes differential thermal growth over the length, l, which reacts against the bellows spring rate, $K_B$, to load the tuning fork 60 and change its resonant frequency. The thermally induced change in load with temperature is given by:

$$\delta F/\delta T = K_B l (\alpha_B - \alpha_C) \quad (5)$$

Using Equation 2, the fractional change in frequency with temperature $S_{TF}$ due to the mechanical stress is defined by:

$$S_{TF} = S_F[K_B l(\alpha_B - \alpha_C)] \quad (6)$$

The thermally induced stress sensitivity, $S_{TF}$, of Equation 6 combines with the unmounted crystal temperature sensitivity, $S_T$, of Equation 4 to minimize the overall temperature sensitivity at desired reference temperatures. That is, the spring rates, coefficients of expansion, dimensions, crystal force sensitivity and crystallographic orientations are chosen such that the overall combined temperature-frequency curve peaks and is thus constant at the desired turnover temperature in the sensor's operating range. The bellows 62 may be replaced with an equivalent spring. However, the sealed bellows 62 isolates the tuning fork 60 from the external environment and thus allows the tuning fork 60 to operate in a vacuum or inert atmosphere 66. The vacuum reduces the energy loss of the tuning fork 60, improving its Q and eliminating contaminants which can cause frequency drift. Also, the bellows 62 allows crystal operation in the vacuum or inert atmosphere 66 and the measurement of external forces while isolating the crystal from the force producing environment.

FIG. 4 illustrates another embodiment of the inventive temperature compensation arrangement. A load sensitive crystal resonator 70 is loaded by force transmitting member 72 which is mounted on a base 74 by a flexure hinge 76, which allows rotation only about an axis perpendicular to the plane of the figure. A bellows or reactive spring 78 reacts against the thermally induced growth to generate mechanical stress on the resonator to compensate for its inherent, unmounted temperature sensitivity. With the use of a bellows 78 the resonator 70 may operate in a vacuum or inert atmosphere 80 within an enclosure 82, so that the device may be used as a force sensor which is isolated from the force producing environment. The overall reactive spring rate includes the effects of the bellows or spring 78 plus the effects of the flexure hinge 76.

FIG. 5 is another embodiment of the inventive bellows and crystal arrangement which isolates a crystal tuning fork 90 from the environment. An enclosure 92 surrounds the tuning fork 90 and a bellows 94 which are connected in series between the end walls of the enclosure 92 such that the tuning fork 90 can operate in a vacuum or inert atmosphere 96 while still sensing forces applied to the tuning fork 90 through the bellows 94. In this embodiment the bellows 94 does not encapsulate the tuning fork 90 as with the embodiment of FIG. 3. The arrangement may also be used to perform the inventive temperature compensation scheme through reactive thermally induced mechanical stress produced by the enclosure 92 and/or bellows 94. The embodiment of FIG. 5, as well as the embodiments of FIGS. 3 and 4, are particularly adapted for use as a pressure sensor, although they may be modified for use as a force sensor. As with the previously described devices, the bellows 94 can be merely a spring having specified thermal characteristics, but tuning fork 90 will then not sense input forces while operating in a vacuum or inert atmosphere. When a spring is used instead of bellows, the basic difference between the embodiments of FIGS. 3 and 5, is that the spring 62 and tuning fork 60 of FIG. 3 are connected in parallel while the spring 94 and tuning fork 90 of FIG. 5 are arranged in series.

FIG. 6 illustrates a crystal force transducer 100 which is insensitive to pressure variations. A housing 102 captures two bellows 104, 106 of equal effective area. Bellows 106 encapsulates a load sensitive crystal resonator 108 which is attached to the housing 102 and a force loading arm 110. Bellows 104, 106 may be evacuated or contain an inert atmosphere 112 in which the resonator 108 operates. Since bellows 104, 106 have the same effective area, forces caused by pressure variations cancel and only forces applied to the loading arm 110 are measured. The bellows spring rates, coefficients of thermal expansion of the bellows 104, 106 and housing 102, dimensions, resonator force sensitivity and crystallographic orientation are such as to minimize overall temperature effects.

FIG. 7 is an isometric view of a temperature and pressure compensated force transducer 120. The transducer 120 employs a suspension system and closed end tuning fork sensor with an isolating bellows arrangement. The transducer includes a force transmitting member 122 positioned between a pair of bellows 124, 126 with the force transmitting member 122 being loaded through one of the bellows 124. External pressure variations are coupled equally to opposite sides of member 122 through the bellows 124, 126 so that they cancel each other. The force transmitting member 122 is mounted on a base 128 through a flexure hinge 130, and the end of the member is secured to a tuning fork force sensor 132. The entire structure is housed within an enclosure 134 so that the tuning fork 132 can resonate in a vacuum or inert environment 136. A force, F, applied to force transmitting member 122 through bellows 124 causes a torque about axis A—A of flexure hinge 130 which applies stress to the closed end tuning fork 132 to change its resonant frequency in accordance with the magnitude of the applied force. Even though bellows 124, 126 have approximately equal areas, area tolerance and mismatches can be compensated for by varying the lever arm distance for one bellows 124, 126 relative to the other. For example, if bellows 126 has a smaller effective area than bellows 124, the transducer 120 can still be made insensitive to pressure variations by moving bellows 126 away from flexure hinge 130, or moving bellows 124 towards flexure hinge 130, thus making the ratio of the lever arms between each bellows 124, 126 and the flexure hinge 130 inversely proportional to the effective areas of the bellows 124, 126. The spring rates of the bellows 124, 126 and the flexure hinge 130 produce the thermal growth reaction forces on the tuning fork 132 for temperature compensation.

I claim:

1. A system for isolating a resonator having a pair of mounts from a force producing environment, comprising an elongated, resilient bellows having its ends closed by respective rigid end covers to which said mounts are secured such that forces imparted to the ends of said bellows are coupled to said resonator while said bellows isolates said resonator from the force producing environment external to said bellows.

2. The isolating system of claim 1, wherein said resonator is a relatively low frequency, flexurally vibrating piezoelectric crystal.

3. The isolating system of claim 2, wherein said resonator is a tuning fork having a pair of tines extending between said mounts.

4. The isolating system of claim 2, wherein said resonator is a resonant beam extending between said mounts.

5. The isolating system of claim 1, wherein said bellows has a coefficient of thermal expansion which is different from the coefficient of thermal expansion of said resonator such that thermally induced stress acts on said resonator in such a way as to result in an overall temperature sensitivity which is lower than the unmounted temperature sensitivity of said resonator at the operating temperature of said resonator.

6. The isolating system of claim 1, further including a second bellows positioned in a coaxial alignment with the bellows surrounding said resonator, the adjacent ends of said bellows being connected to opposite faces of a force receiving member and the remaining ends of said bellows being connected to a rigid frame, the pressures in said bellows being equal to each other such that stress is applied to said resonator responsive to forces on said force receiving member while pressure variations are coupled equally to opposite sides of said force receiving member by said bellows.

7. The isolating system of claim 6, wherein the coefficients of thermal expansion, dimensions, and reactive spring rates are chosen so that thermally induced stress acts on said resonator in such as way as to result in an overall temperature sensitivity which is lower than the unmounted temperature sensitivity of said resonator at the operating temperature of said resonator.

8. A system for isolating a resonator having a pair of mounts from a force producing environment, comprising an airtight enclosure to which one of said mounts is secured, said enclosure having an opening covered by one end of an elongated, flexible bellows, with the other end of said bellows being closed by a rigid end cap to which the other of said mounts is secured such that forces may be applied to said resonator through said bellows while said enclosure and bellows isolate said resonator from a force producing environment external to said enclosure.

9. The isolating system of claim 8, wherein said resonator is a tuning fork having a pair of tines extending between said mounts.

10. The isolating system of claim 8, wherein said resonator is a resonant beam extending between said mounts.

11. The isolating system of claim 8, wherein said bellows has a coefficient of thermal expansion which is different from the coefficient of thermal expansion of the combination of said resonator and enclosure so that thermally induced stress acts on said resonator in such a way as to result in an overall temperature sensitivity which is lower than the unmounted temperature sensitivity of said resonator at the operating temperature of said resonator.

12. A system for isolating a resonator from an external environment, said system comprising a rigid, elongated force transmitting beam, pivotally mounted on the base by a flexure hinge which is relatively compliant about a pivot axis which is perpendicular to the length of said beam, and a resonator extending between said beam and said base, said beam, base, flexure hinge and resonator being positioned in a air-tight enclosure having an opening covered by one end of the flexible bellows extending along the axis which is perpendicular to said pivot axis, the other end of said bellows being closed by an end cap which is secured to said beam such that pressure or forces may be applied from said external environment to said beam through said bellows while said enclosure and bellows isolate said resonator from said external environment.

13. The system of claim 12, wherein the coefficients of thermal expansion, dimensions, and reactive spring rates are chosen so that thermally induced stress acts on said resonator in such a way as to result in an overall temperature sensitivity which is lower than the unmounted temperature sensitivity of said resonator at the operating temperature of said resonator.

14. The system of claim 12, further including a second bellows extending between a surface of said beam opposite said first bellows to a second opening in said enclosure, the cross-sectional areas and positions of said bellows being selected to cause the moment imparted to said beam by the pressure in said first bellows to counteract the moment imparted to said beam by the pressure in said second bellows such that the force applied to said beam through one of said bellows is independent of pressure variations of said external environment.

15. The system of claim 14, wherein said bellows are of equal cross-sectional area and said bellows extend along a common longitudinal axis.

16. A system for temperature compensating a relatively low frequency, flexurally vibrating resonator having a pair of mounts, comprising an elongated spring having its ends connected to respective mounts of said resonator to resiliently bias said resonator, wherein the coefficients of thermal expansion, dimensions, and reactive spring rates are chosen so that thermally induced stress acts on said resonator in such a way as to result in an overall temperature sensitivity which is lower than the unmounted temperature sensitivity of said resonator at the operating temperature of said resonator.

17. The isolating system of claim 16, wherein said resonator is a tuning fork having a pair of tines extending between said mounts.

18. The isolating system of claim 16, wherein said resonator is a resonant beam extending between said mounts.

19. The system of claim 16, wherein said spring and resonator are arranged in substantially parallel relationship with the ends of said spring connected directly to the ends of said resonator.

20. The system of claim 16, wherein said spring and resonator are arranged in a substantially series relationship with one end of said spring connected directly to one end of said resonator and the other end of said spring indirectly connected to the other end of said resonator through an enclosure surrounding said spring and resonator.

21. The system of claim 16, wherein said spring is in the form of a bellows isolating said resonator from an external environment.

22. A system for temperature compensating a relatively low frequency, flexurally vibrating resonator having a pair of mounts, said system comprising a rigid, elongated beam pivotally mounted on a base by a flexure hinge which is relatively compliant about a pivot axis which is perpendicular to the length of said beam, said resonator having one of its mounts secured to one end of said beam while the other of its mounts is carried by said base, the coefficient of thermal expansion and the reactive spring rate of said flexure hinge being chosen such that thermally induced stress acts on said resonator in such a way as to result in an overall temperature sensitivity which is lower than the unmounted temperature sensitivity of said resonator at the operating temperature of said resonator.

23. The system of claim 22, further including an airtight container enclosing said base, beam and resonator, and a bellows extending along an axis perpendicular to said pivot axis from the end of said beam opposite said resonator to an opening in said container, thereby allowing external pressures or forces to be applied to said beam while said enclosure and bellows isolate said crystal resonator from an external environment.

24. The system of claim 23, wherein the coefficients of thermal expansion, dimensions and reactive spring rates of said bellows and enclosure are chosen so that thermal induced stress acts on said resonator in such a way as to result in an overall temperature sensitivity which is lower than the unmounted temperature sensitivity of said resonator at the operating temperature of said resonator.

* * * * *